US008614689B2

(12) United States Patent
Nishikawa et al.

(10) Patent No.: US 8,614,689 B2
(45) Date of Patent: *Dec. 24, 2013

(54) LEAD WIRE CONNECTION METHOD FOR TOUCH PANEL

(75) Inventors: Kazuhiro Nishikawa, Kyoto (JP); Yoshihiro Kai, Kyoto (JP); Kazuto Nakamura, Kyoto (JP)

(73) Assignee: Nissha Printing Co., Ltd., Kyoto (JP)

( * ) Notice: Subject to any disclaimer, the term of this patent is extended or adjusted under 35 U.S.C. 154(b) by 1060 days.

This patent is subject to a terminal disclaimer.

(21) Appl. No.: 11/791,721

(22) PCT Filed: Jan. 16, 2006

(86) PCT No.: PCT/JP2006/000418
§ 371 (c)(1),
(2), (4) Date: May 29, 2007

(87) PCT Pub. No.: WO2006/077784
PCT Pub. Date: Jul. 27, 2006

(65) Prior Publication Data
US 2008/0106522 A1 May 8, 2008

(30) Foreign Application Priority Data
Jan. 24, 2005 (JP) .................. 2005-015409

(51) Int. Cl.
*G06F 3/045* (2006.01)
(52) U.S. Cl.
USPC ...... 345/174; 345/173; 178/18.05; 178/18.06
(58) Field of Classification Search
USPC ............ 345/173–178, 104; 178/18.03–18.09, 178/18.11; 463/37–38; 200/5 A, 511, 512
See application file for complete search history.

(56) References Cited

U.S. PATENT DOCUMENTS 2,752,580 A * 6/1956 Shewmaker .................... 439/75
3,660,726 A * 5/1972 Ammon et al. ............... 174/262
(Continued)

FOREIGN PATENT DOCUMENTS

JP    5-110246       4/1993
JP    06-198576   *  7/1994
(Continued)

OTHER PUBLICATIONS

Taiwanese Office Action (with English Translation) issued Aug. 29, 2012 in corresponding Taiwanese Application No. 95101706.

(Continued)

*Primary Examiner* — Lun-Yi Lao
*Assistant Examiner* — Gregory J Tryder
(74) *Attorney, Agent, or Firm* — Wenderoth, Lind & Ponack, L.L.P.

(57) ABSTRACT

In a method for connecting lead wires to a touch panel, the method includes the steps of: providing through holes 9a to 9d the number of which corresponds to the number of electrode ends by perforation in a lower electrode plate 3; using a metal-pin 11 having a pin-shaft 11b and a disk shaped pin-head 11a with a diameter larger than an outer diameter of the pin-shaft; inserting the pin-shaft 11b into a metal-pin fixing hole formed corresponding to the through hole 9a at a circuit 10c in a connector tail of a lead wire 10, whereby the pin-shaft 11b is erectly provided on the connector tail of the lead wire 10; and inserting the pin-shafts 11b to 14b into the through holes 9a to 9d, and in addition, electrically connecting the pin-shaft inserted into a lower electrode plate 3 through a conductive adhesive 15 to electrode ends 6c, 7c, 6d, 7d.

4 Claims, 5 Drawing Sheets

(56) References Cited

U.S. PATENT DOCUMENTS

| | | | | |
|---|---|---|---|---|
| 5,327,164 | A * | 7/1994 | Fagard et al. | 345/174 |
| 5,656,798 | A * | 8/1997 | Kubo et al. | 174/265 |
| 6,011,222 | A * | 1/2000 | Sekiya et al. | 174/266 |
| 6,023,022 | A * | 2/2000 | Nakamura et al. | 174/88 R |
| 6,677,542 | B2 * | 1/2004 | Katakami | 200/5 A |
| 6,747,217 | B1 * | 6/2004 | Jochym et al. | 174/265 |
| 6,894,682 | B2 | 5/2005 | Nakajima et al. | |
| 7,633,747 | B2 * | 12/2009 | Yang et al. | 361/679.3 |
| 2005/0270272 | A1 * | 12/2005 | Shi | 345/173 |
| 2005/0286238 | A1 * | 12/2005 | Joy | 361/761 |
| 2006/0017703 | A1 * | 1/2006 | Akama et al. | 345/173 |
| 2006/0028119 | A1 * | 2/2006 | Kamiguchi | 313/495 |

FOREIGN PATENT DOCUMENTS

| | | |
|---|---|---|
| JP | 9-50731 | 2/1997 |
| JP | 10-335811 | 12/1998 |
| JP | 10335811 | * 12/1998 |
| JP | 11-150392 | 6/1999 |
| JP | 2001-024393 | * 1/2001 |
| JP | 2001-135395 | 5/2001 |
| JP | 2003-288166 | 10/2003 |
| WO | 2004/098252 | 11/2004 |

OTHER PUBLICATIONS

European Office Action issued May 24, 2011 in corresponding European Application No. 06 711 699.6.

* cited by examiner

LEAD WIRE CONNECTION METHOD FOR TOUCH PANEL

TECHNICAL FIELD

The present invention relates to a method for connecting lead wires to a touch panel used for inputting coordinates on a screen in a mobile phone, a PDA (Personal Digital Assistance) as a personal portable information terminal, a car navigation system, and the like.

BACKGROUND ART

Conventionally, a touch panel display formed by arranging a touch panel on a liquid crystal display in a lamination manner has been widely used for small equipment such as a mobile phone and a PDA, because a screen and a coordinate input means are collectively provided for saving of a space.

As the above-mentioned touch panel, a resistive film type that is simple in structure, thin in thickness and excellent in mass production has generally used. A configuration thereof is as follows: an upper electrode plate having a flexibility as an operation side and a lower electrode plate as a fixed side are oppositely arranged with a predetermined gap by a spacer, and electric circuits are wired in an X direction and a Y direction on an inner surface of each of the electrode plates.

When a surface of the upper electrode plate is pressed with a stylus pen or the like, the upper electrode plate comes into contact with the lower electrode plate to cause an electric potential gradient to be formed between the electrodes, and by taking out the voltage to the outside to calculate an X-axis position and a Y-axis position with a controller, an input point thus pressed is specified.

FIG. 8 shows an assembly method for the above-mentioned touch panel. An upper electrode plate 50 and a lower electrode plate 51 are oppositely arranged. The upper electrode plate 50 is provided with strip-shaped electrodes 50a, 50b in an X direction, while the lower electrode 51 is provided with strip-shaped electrodes 51a, 51b in a Y direction.

The electrodes 50a, 50b, 51a, 51b are extendedly provided to a connecting part 52 provided on an edge of the touch panel so as to be collectively arranged into one point. The connecting part 52 is connected with conductors 53a of lead wires 53 formed of an FPC (Flexible Printed Circuit Board).

In detail, the conductors 53a are designed to be connected to respective electrodes by a conductive paste, and then fixed and held between the upper electrode plate 50 and the lower electrode plate 51 (for example, refer to FIG. 8 of JP-A 09-50731). Further, in the figure, 50c and 51c denote resistive films formed on inner surfaces of the upper electrode plate 50 and the lower electrode plate 51, respectively.

In such a method for connecting lead wires, lead wires are pulled out directly of a side face of the touch panel. In addition, the upper electrode plate 50 is made of a resin sheet and each electrode is made of a silver paste, so that it cannot be said that the electrode itself is rigid. Furthermore, the conductors 53a of the lead wires 53 are connected to the electrodes with a conductive paste of weak fixing force. Therefore, if a little stronger force acts on the lead wire, the wire can be disconnected at the connecting part 52, so that an extreme care has been required to handle the wire.

On the other hand, there has also been proposed the following method by which a damage to a lead wire connecting part is eliminated and the handling of a wire is easily performed.

For example, in a touch panel shown in FIG. 9, four through holes 51d to 51g are provided by perforation to form connecting parts on an edge of the lower electrode plate 51. Concave-type (female-type) connecting metal fixtures 55 are disposed to be buried in the through holes after a conductive paste 54 has been poured thereinto so as to be electrically connected with the electrodes 50a, 50b, 51a, 51b (for example, refer to FIG. 1 of JP-A 09-50731).

In such a touch panel, a signal from the electrodes 50a, 50b, 51a, 51b can be taken out to the outside while maintaining an electrically good connection without pulling the lead wires out directly of the side face of the touch panel.

However, in such a method for taking out a signal by the use of the connecting metal fixtures 55, there is an inconvenience, in that when a touch panel is mounted on a device such as an interface board or a liquid crystal display, four connecting pins for inserting the connecting metal fixtures 55 into positions corresponding to the through holes 51d to 51g must be erectly provided in the device, thereby requiring a change in lead wire connecting structure for both the touch panel and the above-mentioned device.

The present invention has been made in view of the inconvenience in the conventional method for connecting lead wires to the touch panel, and provides a method for connecting lead wires to a touch panel, enabling a connecting strength of lead wires to be increased without requiring a significant design change.

SUMMARY OF INVENTION

The present invention provides a method for connecting lead wires to a touch panel which has an upper electrode panel and a lower electrode panel each having a resistive film on the opposing inner surface thereof, and is provided with a connecting part for connecting the read wires with electrode ends provided extendedly from the electrodes of the resistive film and collectively disposed to the edges of these electrode plates, the method comprising the steps of:

providing through holes the number of which corresponds to the number of electrode ends by perforation in the lower electrode plate;

using a metal-pin having a pin-shaft and a disk shaped pin-head with a diameter larger than an outer diameter of the pin-shaft;

inserting the pin-shaft into a metal-pin fixing hole formed corresponding to the through hole at a conductor wire part in a connector tail of the lead wire, whereby the pin-shaft is erectly provided on the connector tail of the lead wire;

setting the pin-shaft of each metal-pin so that they correspond to the through hole, and inserting the pin-shaft into the through hole while applying an ultrasonic vibration and a pressure thereto so as to allow the wall surface of the through hole to be melted, and the pin-shaft thus inserted to the through hole is fixed to the lower electrode plate by the wall surface is solidified again; and electrically connecting the pin-shaft inserted into the lower electrode plate through a conductive adhesive to the electrode end.

According to the present invention, the pin-shaft is provided by penetrating the lead wire, and the pin-shaft protruded from the lead wire is inserted into the lower electrode plate, thereby allowing the lead wire to be firmly connected to the touch panel via the pin-shaft. Moreover, in a device such as an interface board and a liquid crystal display, it is unnecessary to perform a significant design change.

Further, the metal-pin is equipped with the pin-head having a diameter larger than the outer diameter of the pin-shaft, thereby allowing the metal-pin to be connected to the conductor wire part of the lead wire in a wide range. Further, the pin-head is locked at the edge of the metal-pin fixing hole in the lead wire, thereby allowing the inserted depth of the pin-shaft inserted into the through hole of the lower electrode plate to be controlled.

In the present invention, concave groove are formed in the pin-shaft of the metal-pin, and when the pin-shaft is inserted into the through hole while applying an ultrasonic vibration and a pressure thereto, it is preferable to guide the melted portion of the wall surface of the through hole in the concave groove. Hereby, an anchoring effect can be obtained with respect to the metal-pin.

In the present invention, a part of a protective sheet of a flexiblet prined circuit board as the lead wire is removed so as to allow a conductor wire part at the connector tail to be exposed, then the metal-pin fixing hole is provided by perforation in the conductor wire part thus exposed to insert the metal-pin, and then the disk shaped pin-head of the metal-pin is abutted against the conductor wire part around the metal-pin fixing hole; thus, the metal-pin can be fixed to the connector tail of the lead wire.

In this case, the pin-head is exposed on the outer surface side of the lead wire, so that by utilizing the pin-head thus exposed, an ultrasonic inserting device can be set.

In the present invention, in making the flexible printed circuit board as the lead wire, with the conductor wire part being formed, the metal-pin fixing hole is provided by perforation in the conductor wire part at the connector tail to insert the metal-pin, then the disk shaped pin-head of the metal-pin is abutted against the conductor wire part around the metal-pin fixing hole, and then the protective sheet can also adhere to the conductor wire part and the disk shaped pin-head of the metal-pin.

In this case, if a protective sheet having heat resistance is used, then an ultrasonic inserting device can be set through the protective sheet to the pin-head.

According to the present invention, the method for connecting read wires to the touch panel increasing the connecting strength of the lead wires can be provided without performing a significant design change.

DETAILED DESCRIPTION OF THE INVENTION

Hereinafter, on the basis of an embodiment shown in drawings, the present invention will be explained in detail.

Figure 1:
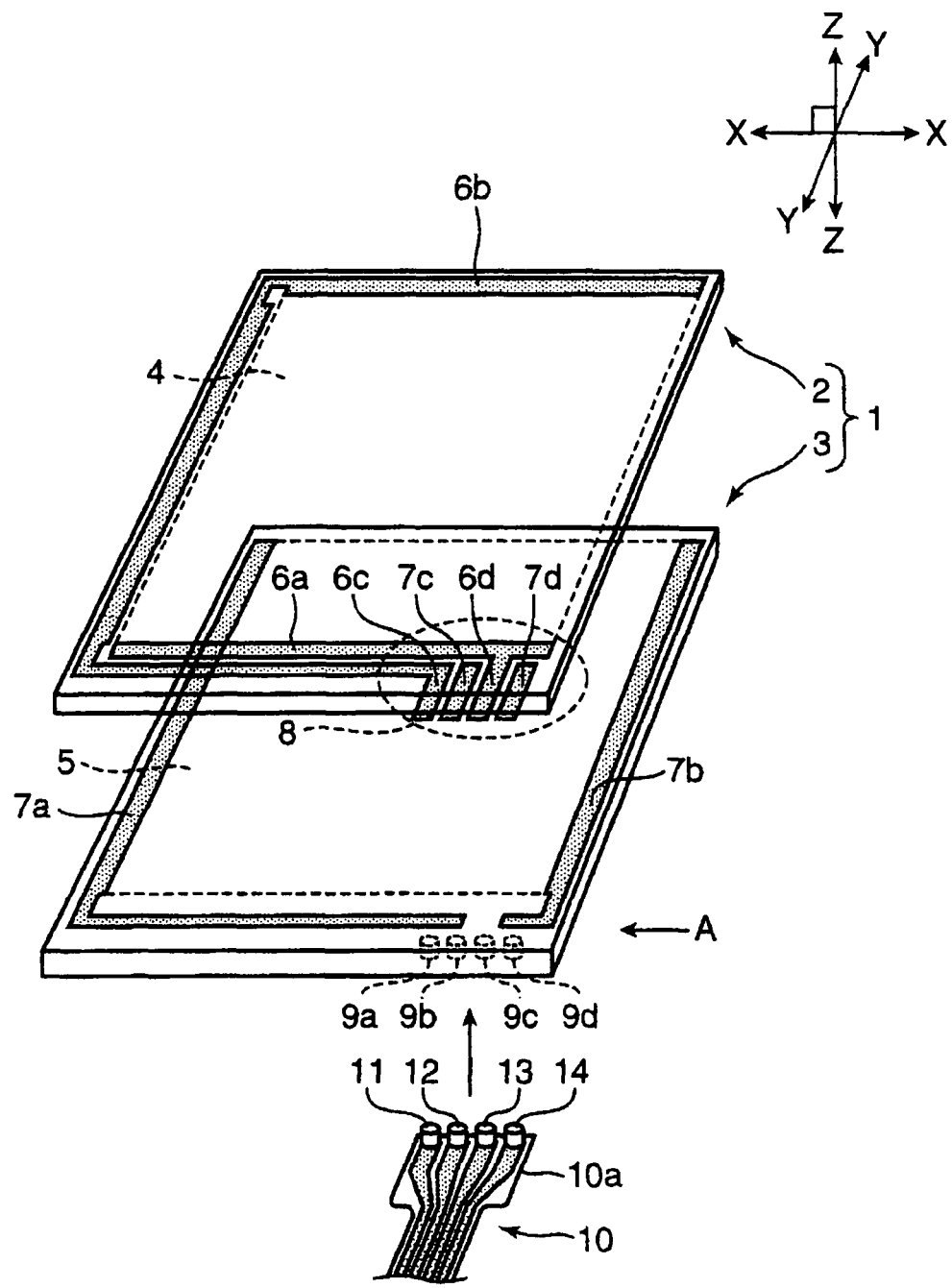
FIG. 1 is an exploded perspective view showing a configuration of a touch panel to which the present invention is applied.

FIG. 1 is an exploded view showing a configuration of a touch panel to which the present invention is applied.

In the figure, a touch panel 1 has an upper electrode plate 2 made of a flexible transparent insulated film, for example, a polyethylene terephthalate film, and a lower electrode plate 3 made of a non-flexible glass plate, or an engineering plastic such as polycarbonate-base, polyamide-base, polyether ketone-base, or a plastic plate such as acryl-base, polyethylene terephthalate-base, polybutylene terephthalate-base, or a laminated plate thereof. The two plates adhere to each other oppositely through a spacer (not shown).

Formed on an inner surface of each of the electrode plates 2, 3 are resistive films 4, 5 with ITO (Indium-Tin Oxide) and the like by spattering or vacuum evaporation.

Strip-shaped electrodes 6a, 6b made of a silver paste connected with the resistive films 4, 5 are formed at the upper electrode plate 2 in an X direction, while strip-shaped electrodes 7a, 7b are formed at the lower electrode plate 3 in a Y direction.

The electrodes 6a, 6b, 7a, 7b are extendedly provided to a connecting part 8 provided on an edge of the upper electrode plate 2 so as to be collectively arranged into one point.

In correspondence to electrode ends 6c, 7c, 6d, 7d at the connecting part 8, through holes 9a to 9d are formed parallel in the lower electrode plate 3 in a Z direction.

Furthermore, in correspondence to these through holes 9a to 9d, four metal-pins 11 to 14 are erectly provided as lead wires at the connector tail of an FPC (Flexible Printed Circuit Board) 10.

Figure 2:
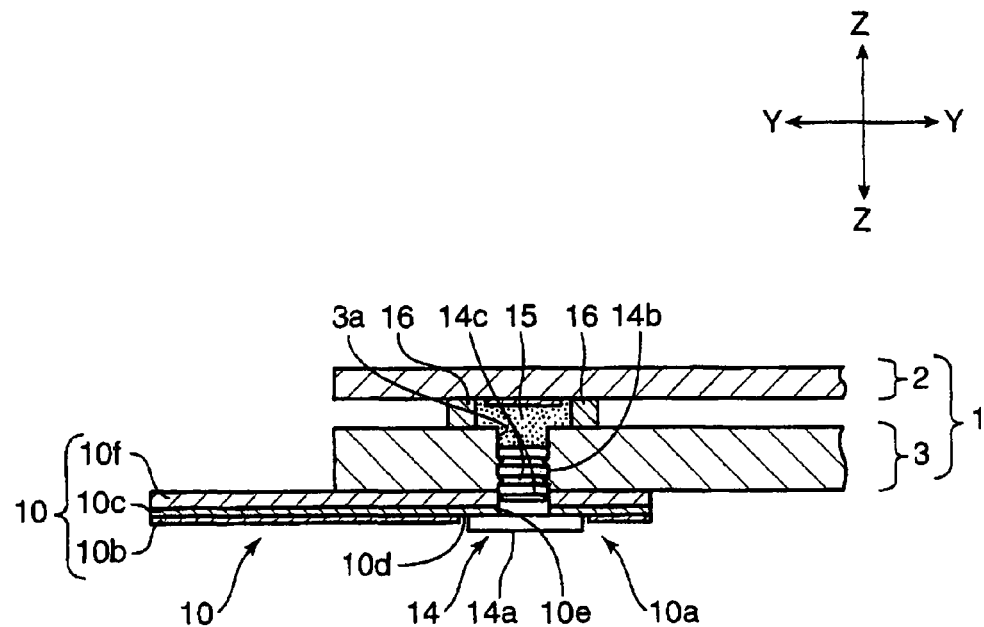
FIG. 2 is an enlarged sectional view of a lead wire connecting part shown in FIG. 1.

FIG. 2 is an enlarged structure of the connector tail of the above-mentioned FPC 10, showing a cross section viewed from an arrow of A direction of FIG. 1.

In that figure, at a connector tail 10a of the FPC, four concave parts 10d, which result from an exposed circuit (conductor wire part) 10c formed by removing a part of a cover lay film 10b as a protective sheet, are arranged in the paper-surface thickness direction, and a metal-pin fixing hole 10e is provided by perforation in the center of each of the concave parts 10d.

Inserted into the metal-pin fixing hole 10e is a metal-pin 14 made of a conductive material, for example, brass, iron, copper or the like, and a disk-shaped head 14a of the metal-pin 14 thus inserted is abutted against the bottom surface (the circuit 10c) of the above-mentioned concave part 10d, whereby a pin-shaft 14b of the metal-pin 14 is designed to be controlled with respect to the inserted depth thereof. Further, in that figure, 10f denotes a base material.

Further, in order to ensure the insulation properties of the head 14a and prevent the deterioration thereof, it is preferable that the metal-pin 14 arranged on the removed part of the cover lay film 10b is coated with a cover lay film piece.

When the metal-pin 14 is embedded in the FPC 10, a method can be usually considered by which the metal-pin 14 is fixed onto the circuit 10c of the FPC 10 with a solder. However, in such a fixing method, if a strong tensile force acts on the FPC 10, then the FPC 10 can be separated from the interface between the metal-pin 14 and the circuit 10c.

On the contrary, in a method for fixing the metal-pin 14 shown in this embodiment, the metal-pin 14 is allowed to pass through the metal-pin fixing hole 10e provided in the FPC 10, and the connector tail 10a of the FPC 10 is urged by the head 14a of the metal-pin 14 to fix the FPC 10 to the lower electrode plate 3, so that the connecting strength of lead wires can be increased compared with the connecting method by the use of a solder.

Further, although in this embodiment, the method for connecting the FPC 10 with the lower electrode plate 3 by using the metal-pin 14 as a representative has been explained, a method for connecting the FPC 10 with the lower electrode plate 3 by using the other metal-pin 11, 12 or 13 is performed in a similar manner.

In this connection, the lead wire connecting strength is about 10 N in a case where four metal-pins 11 to 14 are fixed onto the FPC 10 with a solder to connect to the lower electrode plate 3, whereas the lead wire connecting strength is about 15 N in a case where the FPC 10 is connected to the lower electrode plate 3 by the lead wire connecting method of this embodiment, so that an increase in the lead wire connecting strength has been confirmed. Further, the connecting strength test method has been performed with the equivalent test method as "Peel Adhesive Strength Test Method" specified in JIS K6854-1.

Further, the shaft 14b of the metal-pin 14 used in this embodiment is formed with the concave grooves 14c circumferentially, and the concave grooves 14c are axially formed in multiple stages.

Figure 3:
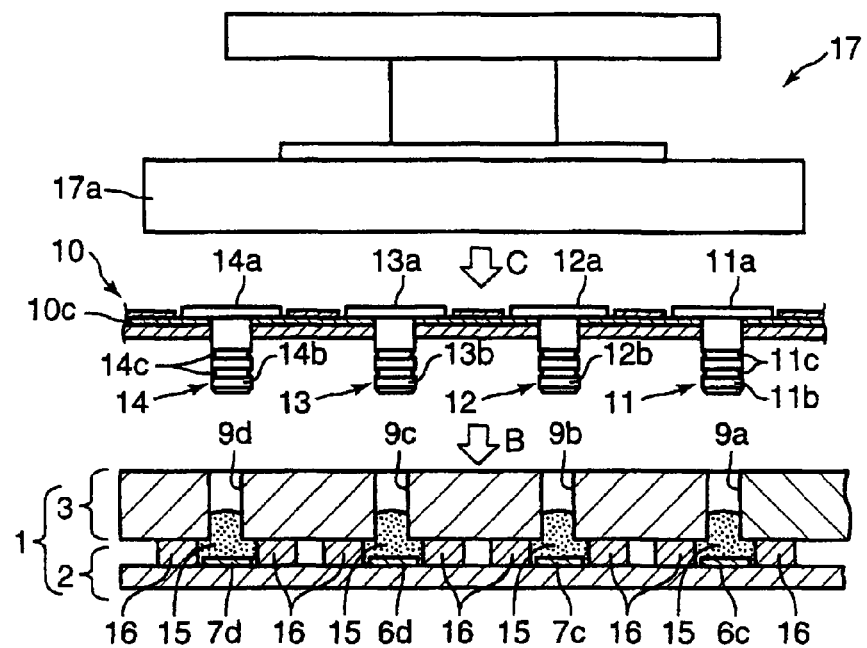
FIG. 3 is an explanatory view showing a method for fixing a metal-pin shown in FIG. 1.

FIG. 3 is a view to help explain a method for fixing the metal-pin 14 having the above-mentioned configuration to the lower electrode plate 3 by an ultrasonic insertion.

However, in order to explain an arrangement of the touch panel 1 and the FPC 10 shown in FIG. 3 with respect to the manufacture process, the arrangement is reverse in the vertical direction to that shown in FIG. 1.

In FIG. 3, the hole diameter of the through holes 9a to 9d formed in the lower electrode plate 3 is set at a value equal to or less than by about 30% the shaft diameter of the metal-pins 11 to 14.

Further, the parts where the electrodes 6c, 7c, 6d, 7d have been arranged in the through holes 9a to 9d are previously injected with a conductive adhesive 15 made of a silver paste, a copper paste or the like in order to assure an electrical connection to these electrodes. Further, 16 denotes a double-side adhesive tape or an adhesive used to define the external limit of the injection range of the conductive adhesive 15.

Then, the metal-pins 11 to 14 are allowed to be lowered in an arrow B direction, and are set at a state in which they abut against the opening edge of the through holes 9a to 9d in the lower electrode plate 3.

Further, the metal-pins 11 to 14 are all together fixed to the lower electrode plate 3 by an ultrasonic inserting device 17, so that a method for fixing the metal-pin 11, as a representative, will be explained in the following description.

A horn 17a of the ultrasonic inserting apparatus 17 is allowed to be lowered in an arrow C direction to make contact with an outer surface of the head 11a of the metal-pin 11.

Then, when the shaft 11b of the metal-pin 11 is allowed to be press fitted into the through hole 9a while applying an ultrasonic vibration and a pressure through the horn 17a to the head 11a, a local frictional heat is generated in the interface between the shaft 11b and the through hole 9a, whereby a resin (or glass) forming the wall surface of the through hole 9a is melted while the metal-pin 11 is inserted.

At this point, the melted resin flows into the multiple concave grooves 11c formed on the shaft 11b of the metal-pin 11.

Figure 4:
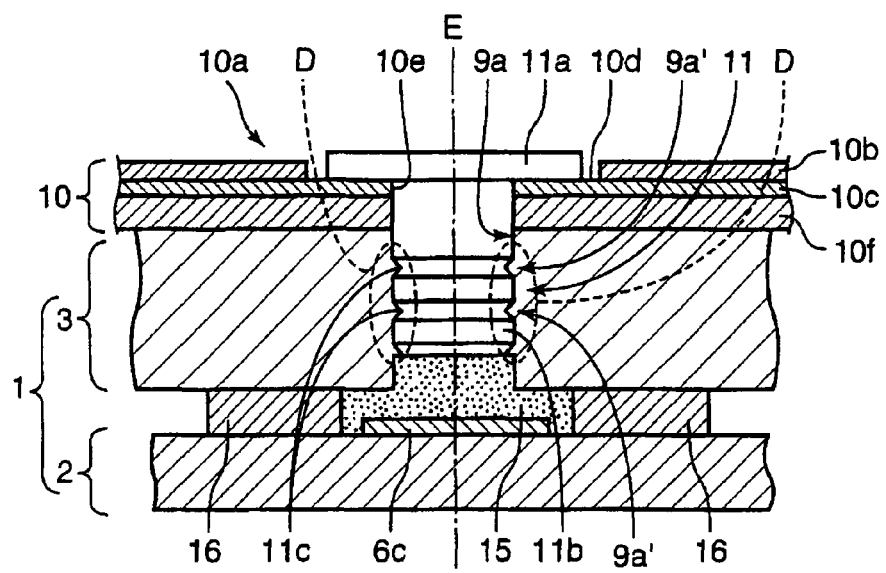
FIG. 4 is an enlarged sectional view of main parts showing a state in which the metal-pin is fixed.

FIG. 4 shows an enlarged view in which the metal-pin 11 has been fixed, and as shown in the figure, the melted resin flows into the concave grooves 11c within a range D surrounded by a broken line, whereby triangular protrusions 9a' are annularly formed along the concave grooves 11c of the metal-pin 11 on the wall surface of the through hole 9a.

Then, when the resin on the through hole wall surface is solidified again by allowing the ultrasonic inserting apparatus 17 to be moved backward, the resin having flowed into the concave groove 11c, that is, the protrusion 9a' provides an anchoring effect on the metal-pin 11, and thus functions to increase the tensile strength of the metal-pin 11.

Further, the metal-pin 11 is inserted from the outer surface side (the upper side on the figure) into the metal-pin fixing hole 10e at the connector tail 10a of the FPC 10, and when the insertion has been completed, the head 11a of the metal-pin 11 comes in contact with the concave part 10d of the FPC 10, that is, the circuit 10c. As a result, the circuit 10c, which is thus held between the head 11a of the metal-pin 11 and the base material 10f, is present, whereby the head 11a of the metal-pin 11 makes a connection with the circuit 10c within a wide area (an annular range) of the head 11a.

In this way, the FPC 10 closely contacts with the lower electrode plate 3, thereby allowing a depth to which the shaft 11b of the metal-pin 11 penetrates in the through hole 9a to be controlled. Hereby, the tip of the shaft 11b of the metal-pin 11 is prevented from hitting the electrode 6c, and in addition, a gap suitable for the connection of the metal-pin 11 with the electrode 6c by the conductive adhesive 15 can be assured.

More specifically, the metal-pin 11 is made shorter in length by 0.1 to 0.2 mm than the thickness of the lower electrode plate 3. Preferably, the metal-pin 11 is made shorter in length by 0.125 mm than the thickness of the lower electrode plate 3.

The other metal-pins 12 to 14 are fixed in the same manner as described above, so that the FPC 10 in which four metal-pins 11 to 14 have been erectly provided at the connector tail 10a can establish a stable electrical connection to the electrodes 6c, 7c, 6d, 7d fixed firmly to the lower electrode plate 3.

Figure 5:
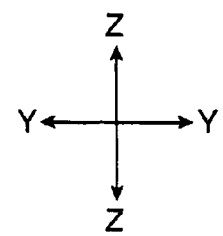
FIG. 5 is a view equivalent to FIG. 2 showing a method for connecting a lower electrode plate with an electrode.
Figure 5:
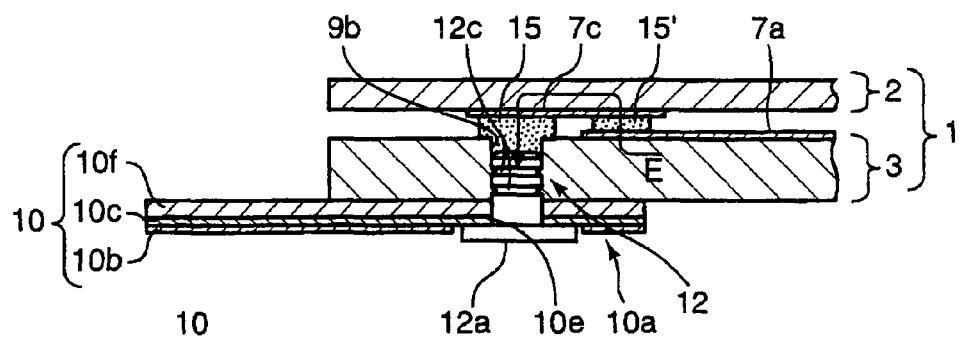

Further, FIG. 5 shows a method for connecting the electrodes 7a, 7b of the lower electrode plate 3 with the FPC 10, and in particular, shows a method for connecting the metal-pin 12, as a representative.

The end of the electrode 7a of the lower electrode plate 3, which terminates in front of the through hole 9b, is connected through a conductive adhesive 15' to the connecting electrode 7c (refer to FIG. 1) formed on the inner surface of the upper electrode 2, and thus, a conductive path E is formed in the order such that the electrode 7a is followed by the conductive adhesive 15', followed by the connecting electrode 7c, followed by the conductive adhesive 15, and followed by the metal-pin 12.

In this way, if the connecting electrode 7c is provided and configured such that the metal-pin 12 is connected through the conductive adhesive 15 to the connecting electrode 7c, the metal-pin 12 can be connected to the lower electrode plate 3 in the same conditions as the other electrodes 6c, 6d. Also, similarly to the above-mentioned method for connecting the metal-pin 11, a certain gap suitable for providing the conductive adhesive 15 between the connecting electrode 7c and the tip of the metal-pin 12 can be established.

Figure 6:
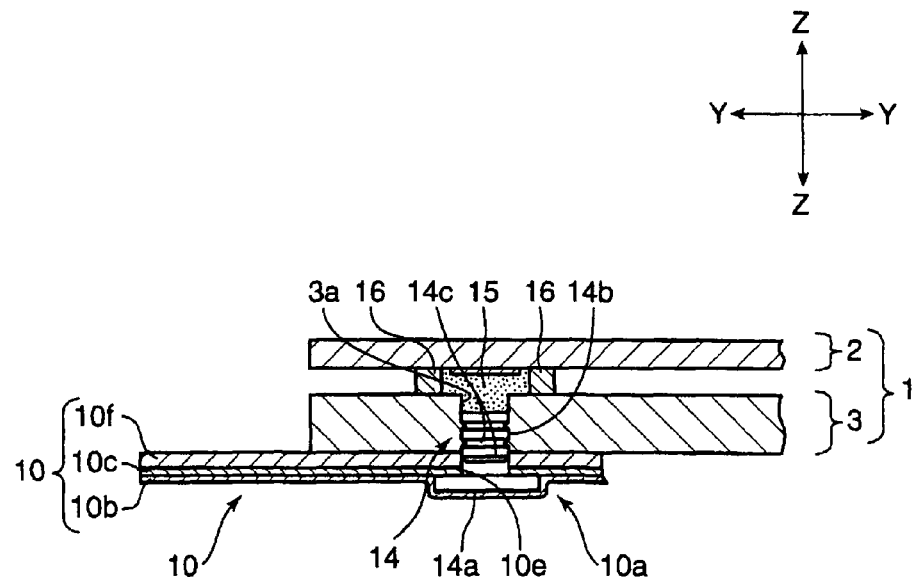
FIG. 6 is a view equivalent to FIG. 2 showing another configuration of the lead wire connecting part.

FIG. 6 shows another configuration of the lead wire connecting part.

In the mounting of the metal-pin 14 shown previously in FIG. 2, a part of the cover lay film 10b is removed at the connecting-side part 10a of the FPC so as to expose the circuit 10c, then the metal-pin fixing hole 10e is provided by perforation in the circuit part thus exposed, and then the metal-pin 14 is inserted in the metal-pin fixing hole 10e.

On the contrary, in the FPC 10, before the cover lay film 10b is allowed to adheres to the lead wire connecting part shown in FIG. 6, the metal-pin fixing hole 10e is provided by perforation in the circuit 10c as a conductive part in the connector tail part 10a, then the metal-pin 14 is inserted into the metal-pin fixing hole 10e, and then the cover lay film 10b is allowed to adhere onto the circuit 10c and the base material 10f with a self-adhesive or an adhesive so as to cover the head 14a. Further, a polyimide film of high heat-resistant is used for the above-mentioned cove lay film 10b.

In this way, when the head 14a of the metal-pin is coated with the cover lay film 10b, the metal-pin 14 can be more firmly fixed to the circuit 10c. Also, the insulation properties between the metal-pins 14 adjacent to each other can be established, and in addition, since the head 14a of the metal-pin is not exposed to the air, any deterioration due to oxidation, corrosion and the like can be prevented.

Further, when the cover lay film 10b is allowed to adhere, it is preferable to perform a deaeration treatment such as vacuum press and the like after adhering so as not to introduce air bubble.

Further, the method of allowing the cover lay film 10b to adhere after the insertion of the metal-pin 14 has a fewer processes and a better workability, and can more easily prevent the air bubble from occurring, compared with the above-described method of removing a part of the cover lay film 10b to cover additionally the metal-pin with a cover lay film piece.

Figure 7:
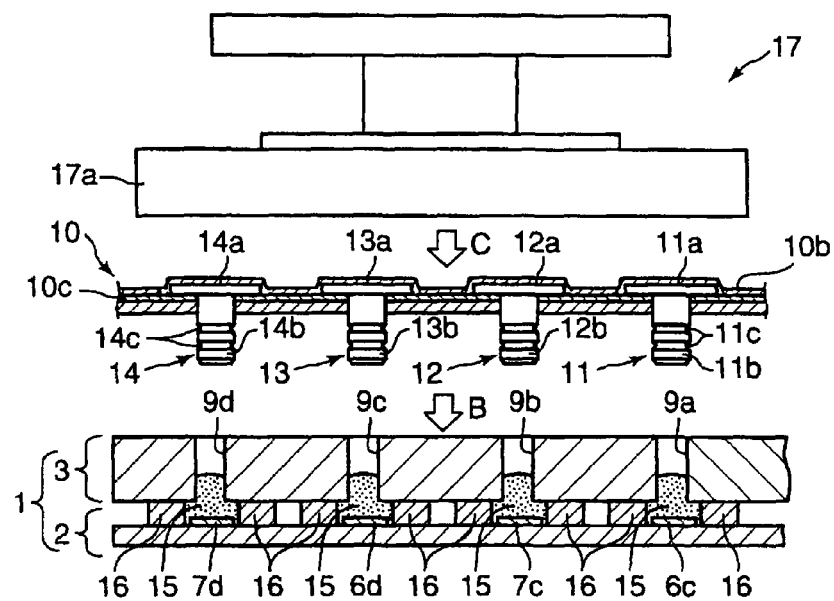
FIG. 7 is a view equivalent to FIG. 3 showing a method for fixing a metal-pin shown in FIG. 6.
Figure 8:
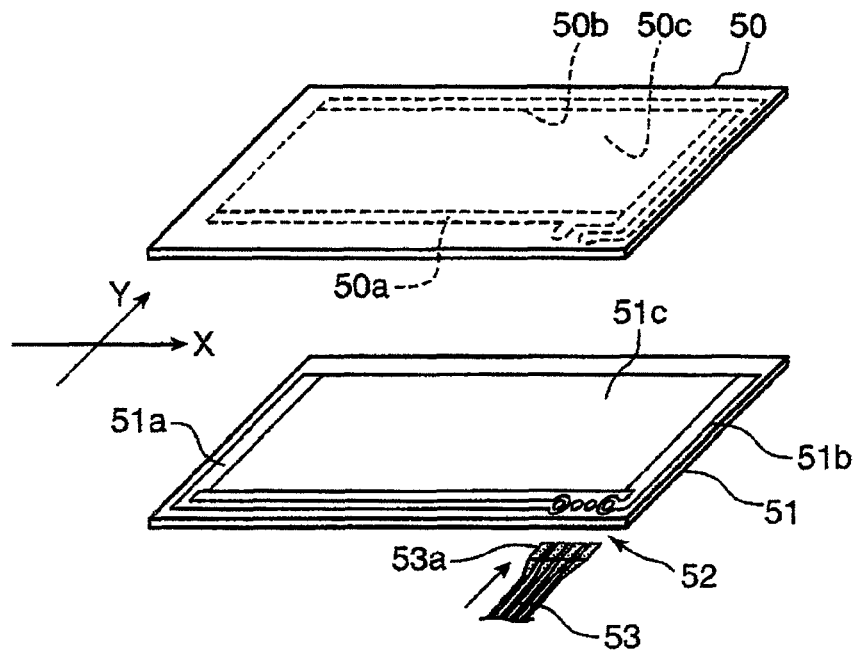
FIG. 8 is a perspective view showing a lead wire connecting structure of a conventional touch panel.
Figure 9:
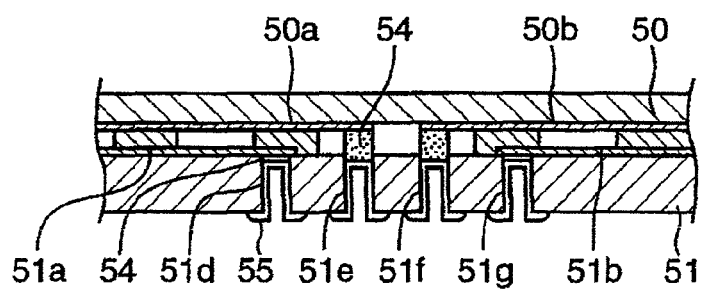
FIG. 9 is an enlarged sectional view showing another lead wire connecting structure of a conventional touch panel.

FIG. 7 is a view to explain a method for fixing the metal-pin 14 coated with the above-mentioned cover lay film 10b to the lower electrode plate 3 by the ultrasonic insertion. Further, the fixing method itself by the ultrasonic insertion is the same as the one shown in FIG. 3, so that like components will be given the same symbols and the explanation thereof will be omitted.

In FIG. 7, the horn 17a of the ultrasonic inserting device 17 is allowed to be lowered in the arrow C direction so as to make contact the horn 17a through the cover lay film 10b with the outer face of the heads 11a to 14a of the metal-pins 11 to 14.

Then, the shafts 11b to 14b of the metal-pins are allowed to be press fitted in the through holes 9a to 9d while applying an ultrasonic vibration and a pressure to the heads 11a to 14a.

Hereby, explaining the metal-pin 11 as a representative, a local frictional heat is generated in the interface between the shaft 11b and the through hole 9a, whereby the resin (or glass) forming the wall surface of the through hole 9a is melted while the metal-pin 11 is inserted, and thus the metal-pin 11 is fixed to the lower electrode plate 3.

Further, the cover lay film 10b held between the horn 17a and the metal-pin 11 employs a polyimide film of high heat-resistant, and therefore cannot be melted.

Further, although in the above-mentioned embodiment, the shaft of the metal-pin has been fixed to the lower electrode plate by the ultrasonic insertion, the fixing method is not limited thereto, that is, the shaft of the metal-pin can be fixed to the through hole of the lower electrode plate with a conductive adhesive. In that case, the hole diameter of the through holes 9a to 9d formed in the lower electrode plate 3 is set at a value larger than the shaft diameter of the metal-pins 11 to 14 by 50 to 100 µm, and when the metal-pins 11 to 14 are inserted into the through holes 9a to 9d, the conductive adhesive 15 can flow into the gap between the through holes 9a to 9d and the shafts 11b to 14b of the metal-pins 11 to 14.

INDUSTRIAL APPLICABILITY

The method for connecting lead wires to the touch panel of the present invention can be suitably utilized in manufacturing a touch panel for, for example, a mobile phone, a PDA and a car navigation system.

The invention claimed is:
1. A method for connecting lead wires to a touch panel which has an upper electrode plate and a lower electrode plate each having a resistive film on an opposing inner surface thereof, and is provided with a connecting part for connecting the lead wires with electrode ends provided extendedly from electrodes of the resistive films and collectively disposed at edges of the electrode plates, the method comprising the steps of:

providing through holes by perforation in the lower electrode plate, the number of through holes corresponding to the number of electrode ends;

using metal-pins, each of the metal-pins having a pin-shaft and a disk shaped pin-head with a diameter larger than an outer diameter of the pin-shaft, and a length of the pin-shaft being less than a thickness of the lower electrode plate, inserting each pin-shaft into a corresponding one of metal-pin fixing holes formed at a conductor wire part in a connector tail of the lead wires, whereby each pin-shaft is erectly provided on the connector tail of the lead wires;

setting the pin-shaft of each metal-pin so as to be aligned with a corresponding one of the through holes, and inserting each pin-shaft into the corresponding through hole while applying an ultrasonic vibration and a pressure thereto so as to allow a wall surface of each through hole to be melted, and such that each pin-shaft thus inserted into the corresponding through hole is fixed to the lower electrode plate by allowing the wall surface of each through hole to solidify; and electrically connecting each pin-shaft inserted into the lower electrode plate to a corresponding one of the electrode ends through a conductive adhesive injected into a gap between each pin-shaft and the corresponding electrode end, wherein the connector tail is a connector tail of a flexible printed circuit board, wherein concave grooves are formed in the pin-shaft of each metal-pin, and wherein during said inserting of each pin-shaft into the corresponding through hole while applying the ultrasonic vibration and the pressure thereto, a melted portion of the wall surface of each through hole is guided into the concave grooves of the corresponding pin-shaft, wherein the method further comprises, before said inserting of each pin-shaft into a corresponding metal-pin fixing hole, removing a part of a protective sheet of the flexible printed circuit board so as to allow the conductor wire part at the connector tail to be exposed, and then forming the metal-pin fixing holes by perforation in the conductor wire part, and wherein said inserting of each pin-shaft into the corresponding metal-pin fixing hole comprises inserting the pin-shaft of each metal-pin into the corresponding metal-pin fixing hole such that the disk shaped pin-head of each metal-pin is abutted against the conductor wire part around the corresponding metal-pin fixing hole.

2. A method for connecting lead wires to a touch panel which has an upper electrode plate and a lower electrode plate each having a resistive film on an opposing inner surface thereof, and is provided with a connecting part for connecting the lead wires with electrode ends provided extendedly from electrodes of the resistive films and collectively disposed at edges of the electrode plates, the method comprising the steps of:

providing through holes by perforation in the lower electrode plate, the number of through holes corresponding to the number of electrode ends;

using metal-pins, each of the metal-pins having a pin-shaft and a disk shaped pin-head with a diameter larger than an outer diameter of the pin-shaft, and a length of the pin-shaft being less than a thickness of the lower electrode plate, inserting each pin-shaft into a corresponding one of metal-pin fixing holes formed at a conductor wire part in a connector tail of the lead wires, whereby each pin-shaft is erectly provided on the connector tail of the lead wires;

setting the pin-shaft of each metal-pin so as to be aligned with a corresponding one of the through holes, and inserting each pin-shaft into the corresponding through hole while applying an ultrasonic vibration and a pressure thereto so as to allow a wall surface of each through hole to be melted, and such that each pin-shaft thus inserted into the corresponding through hole is fixed to the lower electrode plate by allowing the wall surface of each through hole to solidify; and electrically connecting each pin-shaft inserted into the lower electrode plate to a corresponding one of the electrode ends through a conductive adhesive injected into a gap between each pin-shaft and the corresponding electrode end, wherein the connector tail is a connector tail of a flexible printed circuit board, wherein concave grooves are formed in the pin-shaft of each metal-pin, and wherein during said inserting of each pin-shaft into the corresponding through hole while applying the ultrasonic vibration and the pressure thereto, a melted portion of the wall surface of each through hole is guided into the concave grooves of the corresponding pin-shaft, wherein said inserting of each pin-shaft into a corresponding metal-pin fixing hole comprises inserting the pin-shaft of each metal-pin into the corresponding metal-pin fixing hole such that the disk shaped pin-head of each metal-pin is abutted against the conductor wire part around the corresponding metal-pin fixing hole, and wherein the method further comprises:

before said inserting of the pin-shaft of each metal-pin into the corresponding metal-pin fixing hole, forming the metal-pin fixing holes by perforation in the conductor wire part at the connector tail; and after said inserting of the pin-shaft of each metal-pin into the corresponding metal-pin fixing hole, adhering a protective sheet onto the conductor wire part and the disk shaped pin-head of each metal-pin.

3. A method for connecting lead wires to a touch panel which has an upper electrode plate and a lower electrode plate each having a resistive film on an opposing inner surface thereof, and is provided with a connecting part for connecting the lead wires with electrode ends provided extendedly from electrodes of the resistive films and collectively disposed at edges of the electrode plates, the method comprising the steps of:

providing through holes by perforation in the lower electrode plate, the number of through holes corresponding to the number of electrode ends;

using metal-pins, each of the metal-pins having a pin-shaft and a disk shaped pin-head with a diameter larger than an outer diameter of the pin-shaft, and a length of the pin-shaft being less than a thickness of the lower electrode plate, inserting each pin-shaft into a corresponding one of metal-pin fixing holes formed at a conductor wire part in a connector tail of the lead wires, whereby each pin-shaft is erectly provided on the connector tail of the lead wires;

setting the pin-shaft of each metal-pin so as to be aligned with a corresponding one of the through holes, and inserting each pin-shaft into the corresponding through hole while applying an ultrasonic vibration and a pressure thereto so as to allow a wall surface of each through hole to be melted, and such that each pin-shaft thus inserted into the corresponding through hole is fixed to the lower electrode plate by allowing the wall surface of each through hole to solidify; and electrically connecting each pin-shaft inserted into the lower electrode plate to a corresponding one of the electrode ends through a conductive adhesive injected into a gap between each pin-shaft and the corresponding electrode end, wherein the connector tail is a connector tail of a flexible printed circuit board, wherein the method further comprises, before said inserting of each pin-shaft into a corresponding metal-pin fixing hole, removing a part of a protective sheet of the flexible printed circuit board so as to allow the conductor wire part at the connector tail to be exposed, and then forming the metal-pin fixing holes by perforation in the conductor wire part, and wherein said inserting of each pin-shaft into the corresponding metal-pin fixing hole comprises inserting the pin-shaft of each metal-pin into the corresponding metal-pin fixing hole such that the disk shaped pin-head of each metal-pin is abutted against the conductor wire part around the corresponding metal-pin fixing hole.

4. A method for connecting lead wires to a touch panel which has an upper electrode plate and a lower electrode plate each having a resistive film on an opposing inner surface thereof, and is provided with a connecting part for connecting the lead wires with electrode ends provided extendedly from electrodes of the resistive films and collectively disposed at edges of the electrode plates, the method comprising the steps of:

providing through holes by perforation in the lower electrode plate, the number of through holes corresponding to the number of electrode ends;

using metal-pins, each of the metal-pins having a pin-shaft and a disk shaped pin-head with a diameter larger than an outer diameter of the pin-shaft, and a length of the pin-shaft being less than a thickness of the lower electrode plate, inserting each pin-shaft into a corresponding one of metal-pin fixing holes formed at a conductor wire part in a connector tail of the lead wires, whereby each pin-shaft is erectly provided on the connector tail of the lead wires;

setting the pin-shaft of each metal-pin so as to be aligned with a corresponding one of the through holes, and inserting each pin-shaft into the corresponding through hole while applying an ultrasonic vibration and a pressure thereto so as to allow a wall surface of each through hole to be melted, and such that each pin-shaft thus inserted into the corresponding through hole is fixed to the lower electrode plate by allowing the wall surface of each through hole to solidify; and electrically connecting each pin-shaft inserted into the lower electrode plate to a corresponding one of the electrode ends through a conductive adhesive injected into a gap between each pin-shaft and the corresponding electrode end, wherein the connector tail is a connector tail of a flexible printed circuit board, and wherein said inserting of each pin-shaft into a corresponding metal-pin fixing hole comprises inserting the pin-shaft of each metal-pin into the corresponding metal-pin fixing hole such that the disk shaped pin-head of each metal-pin is abutted against the conductor wire part around the corresponding metal-pin fixing hole, and wherein the method further comprises:

before said inserting of the pin-shaft of each metal-pin into the corresponding metal-pin fixing hole, forming the metal-pin fixing holes by perforation in the conductor wire part at the connector tail; and after said inserting of the pin-shaft of each metal-pin into the corresponding metal-pin fixing hole, adhering a protective sheet onto the conductor wire part and the disk shaped pin-head of each metal-pin.

\* \* \* \* \*

UNITED STATES PATENT AND TRADEMARK OFFICE
CERTIFICATE OF CORRECTION

| | | |
|---|---|---|
| PATENT NO. | : 8,614,689 B2 | Page 1 of 1 |
| APPLICATION NO. | : 11/791721 | |
| DATED | : December 24, 2013 | |
| INVENTOR(S) | : Kazuhiro Nishikawa et al. | |

It is certified that error appears in the above-identified patent and that said Letters Patent is hereby corrected as shown below:

On the Title Page
In Item (86), line 1 change "PCT/JP2006/000418" to --PCT/JP2006/300418--.

Signed and Sealed this
First Day of July, 2014

Michelle K. Lee
*Deputy Director of the United States Patent and Trademark Office*